United States Patent [19]

Peart et al.

[11] 3,958,317
[45] May 25, 1976

[54] COPPER SURFACE TREATMENT FOR EPOXY BONDING

[75] Inventors: Leland L. Peart, San Clemente; John S. Schiavo, Placentia, both of Calif.

[73] Assignee: Rockwell International Corporation, El Segundo, Calif.

[22] Filed: Sept. 25, 1974

[21] Appl. No.: 508,933

[52] U.S. Cl. .................................. 29/195; 204/41; 204/38 E; 428/336; 428/344; 428/349; 428/354; 428/416; 428/418; 428/474; 428/458; 428/209; 428/210; 428/901
[51] Int. Cl.² ...................... B23P 3/20; B32B 3/14; B32B 15/08
[58] Field of Search ...................... 161/DIG. 7, 186; 29/195 P; 428/901, 416, 418, 209, 210, 195, 474, 458, 344, 349, 336, 354, 355; 204/41, 38 E

[56] References Cited
UNITED STATES PATENTS

| | | | |
|---|---|---|---|
| 3,230,163 | 1/1966 | Dreyfus | 161/DIG. 7 |
| 3,244,581 | 4/1966 | Miller | 161/186 |
| 3,536,546 | 10/1970 | Nielsen | 161/186 |
| 3,681,209 | 8/1972 | Campbell | 29/195 P |
| 3,761,303 | 9/1973 | Cox | 29/195 P |
| 3,770,571 | 11/1973 | Alsberg | 161/DIG. 7 |
| 3,771,977 | 11/1973 | Liu | 29/195 P |
| 3,790,355 | 2/1974 | Palisin | 29/195 P |
| 3,857,683 | 12/1974 | Castonguay | 29/195 P |

*Primary Examiner*—Marion E. McCamish
*Assistant Examiner*—Ellis P. Robinson
*Attorney, Agent, or Firm*—H. Fredrick Hamann; G. Donald Weber, Jr.; Gilbert H. Friedman

[57] ABSTRACT

A treated copper surface for bonding, using adhesive such as epoxy glass, in applications such as multilayer circuit boards. The copper surface is covered with a thin layer of chromium having a roughened (etched) outer surface. The chromium layer precludes chemical reactions which destroy the polar groups of epoxy molecules and which thereby cause delamination of copper-epoxy bonds. The etched surface greatly enhances the bond strength by providing a roughened cracked surface which provides a strong mechanical bond. Copper surfaces treated in this manner form epoxy glass bonds having tensile strengths of about 2750 psi.

7 Claims, 1 Drawing Figure

COPPER SURFACE TREATMENT FOR EPOXY BONDING

BACKGROUND OF THE INVENTION

1. Field of the Invention

This invention relates to adhesive bonding of copper surfaces used in applications such as multilayer circuit boards and, more particularly, to a process and a resulting composite for enhancing the adhesion of adhesives such as epoxy glass to copper surfaces.

2. Description of the Prior Art

Epoxy adhesives are widely used to adhere copper conductors, ground planes, etc., to other structural components in applications such as circuit boards and multilayer boards. Prepreg adhesive is frequently used in such applications. Prepreg adhesive is a glass fabric which is impregnated with B-staged epoxy resin. "B-stage" is an intermediate stage in the reaction of a thermosetting resin such that, when temperature and pressure are applied, the resin softens, liquifies, gels, and then cures, completing the epoxy-resin setting reaction. At this final stage, the epoxy resin in permanently hardened.

Use of the B-stage epoxy resin and the glass fabric provides an adhesive that may be easily handled, stored and cut to the proper dimensions. However, epoxy glass prepreg materials provide only marginal adhesion to copper surface areas. This marginal adhesion is attributed primarily to chemical reactions which occur at the copper-epoxy interface. First, it should be noted that epoxy glass prepreg materials are adhered to copper components using lamination techniques which involve pressure and heat and, frequently, heat cycling. Unfortunately, if such an epoxy adhesive is heated while in contact with copper, a dehydrogenation reaction takes place which reduces the polar nature of the groups on the epoxy molecule which provide adhesion. In addition, the hydrogen released by the reaction reacts with and tends to destroy any copper oxide by reducing the oxide to copper and water. This also is detrimental to the adhesion between the copper and the epoxy adhesive because copper oxide films are porous and the porosity enhances mechanical bonding between the copper and the epoxy glass adhesive. See "Preventing Delamination of Circuit Boards and Flexible Cicuits," *Insulation/Circuits*, pg. 1973, pg. 34–35, by Schuessler.

Numerous copper surface treatments have been attempted to enhance the copper-epoxy glass prepreg bonds, with limited success. The treatments include priming with epoxy resin, sputtering aluminum, black oxiding, and mechanical cross-hatching. As may be appreciated, it is highly desirable to have a means of enhancing the bond between copper surfaces and epoxy glass prepreg materials.

SUMMARY OF THE INVENTION

According to the present invention, a treated copper surface is provided for enhanced bonding to adhesives such as epoxy glass. The treated surface is provided by forming on the copper surface a layer, or coating of chromium having a cracked, roughened surface. A preferred thickness for the chromium is 10–20 microinches. The chromium can be formed on the copper surface using electrodeposition, and then electroetched to provide the chromium cracking. The chromium surface provides excellent chemical bonding with epoxy glass prepreg adhesive while the cracking provides a mechanical lock with the adhesive to further enhance the bonding.

DETAILED DESCRIPTION OF PREFERRED EMBODIMENT

Figure 1:
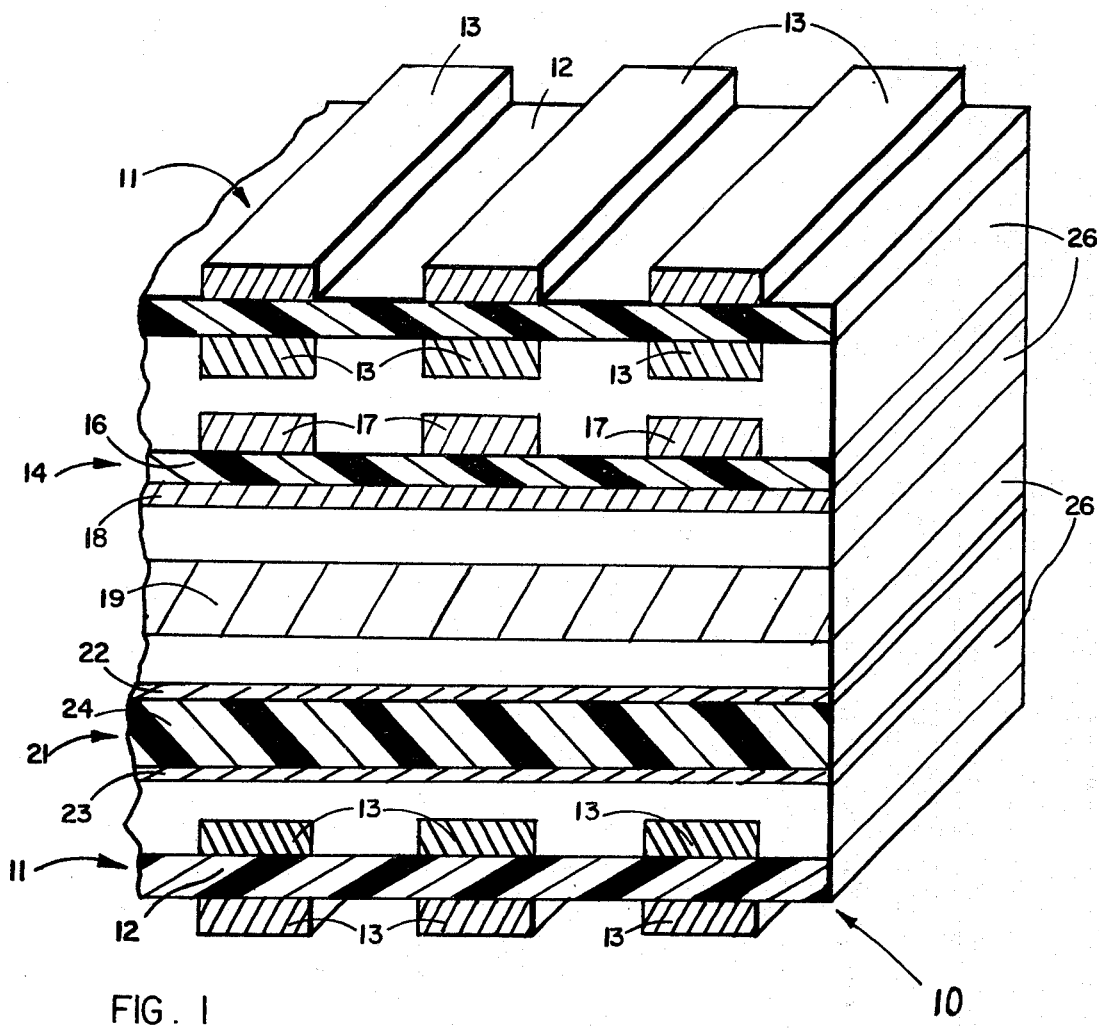
FIG. 1 is a schematic representation of a multilayer circuit board having several copper-prepreg epoxy interfaces.

Referring to FIG. 1, there is shown a multilayer board 10 comprising several structures having copper conductors and planes. These structures are illusrative of the various types of structures which are bonded using prepreg epoxy glass and which benefit from the enhanced bond strength provided by the copper surface treatment of the present invention. The illustrated stuctures include a pair of single layer circuit board details 11 comprising an insulating substrate 12 and conductors 13, typically of copper (and, usually, other conductors and circuit components which are not shown); a copper plane detail 14 comprising an insulating substrate 16 having individual copper conductors 17 on one side and a copper conducting plane 18 on the other side; a heat sink core 19 of material such as copper; and a ground or voltage plane assembly 21 formed from copper planes 22 and 23 affixed to an insulating substrate 24. The first, upper detail 11 is secured to and insulated from detail 14 by a layer of prepreg adhesive 26, as are detail 14 and heat sink core 19, heat sink core 19 and ground and voltage plane assembly 21, and assembly 21 and the second, lower circuit board detail 11.

According to the present invention, the bonding of the adhesive 26 to the various copper components (e.g. copper conductors 13 and 17, copper conductor planes 18, 22, and 23, and heat sink core 19) is considerably enhanced. More precisely, the copper-epoxy bond is supplanted by a chromium-epoxy bond which is decidedly stronger.

Typically, the chromium can be formed on the various copper surfaces (selectively if necessary) by depositing chromium, for example 10–20 microinches thick, using techniques which are well known in the art, then etching the chromium surface to produce chromium cracking. For example, the chromium can be formed by (but is not limited to) electrolytic deposition using an aqueous bath containing about 33 oz/gal $CrO_3$ and 0.33 oz/gal $H_2SO_4$, 3 asi (amperes per square inch), 135°F and using a deposition time of about 5 minutes. The etching can be done by electroetching in a 10 percent solution of sodium hydroxide for about 10 seconds with 6 v. applied. Other examples of techniques for producing chromium cracking are: abrasive honing, chemical etching, cathodic acid etching, and anodic acid etching.

The chromium deposit is not subject to the previously mentioned reactions which deleteriously affect copper-epoxy bonds. That is, the polar groups on the epoxy molecules maintain their integrity using chromium. In addition, the etching provides a mechanical lock since, before curing, the resin in the prepreg adhesive flows into the cracks provided by the etching.

The strength of bonds between etched chromium-plated copper and epoxy was compared to bond strengths provided by other copper surface treatments. Etched chromium-plated copper strips 3 × 6 inches in dimension were joined by laminating prepreg adhesive at one-half inch long lap sections along end portions of the inner surfaces of the strips. In order to closely approximate the conditions used to form structures such as the multilayer board 10 (FIG. 1), two plies of prepreg adhesive were inserted between the copper strips, then the strips were laminated at the lap sections using heat and pressure, resp., of 350° ± 10°F and 150 psi for about 4–60 minutes.

The test specimen and other specimens, which were identical except for the use of different copper surface treatments, were placed in a tensile tester and pulled apart at a rate of 0.050 inches per minute. Tensile shear strengths (psi) were then determined by dividing the maximum load at rupture (lbs) by bond area (in$^2$). The table below shows the average shear strengths of three specimens obtained for each of the various types of samples, including the chromium-plated, electroetched test sample (sample type 8) formed according to the principles of the present invention.

TABLE

TENSILE SHEAR STRENGTHS

| Sample Type Number | Copper Surface Treatment | Tensile Shear Strength, psi | | | Average |
|---|---|---|---|---|---|
| 1 | Black Oxide* | 2090. | 1970. | 1600 | 1887 |
| 2 | Sputtered Aluminum | 1500. | 1400. | 1400 | 1425 |
| 3 | Sputtered, then Stripped Aluminum | 1500. | 1500. | 1500 | 1500 |
| 4 | Vapor Honed | 2320. | 2310. | 1990 | 2207 |
| 5 | Chromium Plated | 2150. | 2200. | 2300 | 2217 |
| 6 | Nitric-Acetic Acid Etched | 2160. | 2030. | 1990 | 2060 |
| 7 | Epoxy Resin Primed | 1170. | 1510. | 1500 | 1393 |
| 8 | Chromium Plated, Electroetched | 2800. | 2700. | 2750** | 2750 |

*Using Ebanol C oxidizing solution, made by the Enthone Co. of Westhaven, Conn.
**No failure at the epoxy-chromium bond line. Epoxy (prepreg) adhesive tore apart in all three tests.

As is evident, a copper surface treated by chromium plating alone (sample type No. 5) provides tensile shear strengths which are at least the equal of the best (vapor honed sample type No. 4) of the prior art surface treatments. When, as per sample type No. 8, the chromium plating is etched, the tensile shear strength is increased substantially, to about 2750 psi average. In fact, the adhesive itself, not the bond, failed during the testing of sample type No. 8, indicating that the 2750 psi shear strength is below the true strength of the bond itself. Although etched chromium surfaces have been used in applications such as aircraft engines (where the etched surface is used to enhance lubricant retention), the bond strength provided by the chromium plated copper surfaces is unexpected. Moreover, the significant increase in bond strength provided by etching is also not to be expected based upon prior knowledge.

Thus, there has been provided a copper surface treatment and a resulting composite which greatly enhances the bond strength between copper surfaces and epoxy glass adhesive. The scope of the invention is not limited to epoxy glass adhesives. Specifically, bonding provided by adhesives such as the relatively recently developed polyimide adhesives are enhanced by the copper surface treatment of the present invention. Accordingly, the scope of the invention is limited only by the claims appended hereto and equivalents thereof.

Having thus described a preferred embodiment of the invention, what is claimed is:

1. A multilayer circuit board comprising:
   an insulating substrate;
   a copper member having first and second opposed surfaces,
   said first surface bonded to said insulating substrate;
   an electrodeposited layer of chromium of approximately 10–20 microinches thickness on the second surface of said copper member,
   said layer of chromium having a roughened surface; and
   a layer of adhesive selected from the group consisting of epoxy adhesive, epoxy glass adhesive and polyimide adhesive bonded to the roughened surface of said chromium layer.

2. The multilayer circuit board set forth in claim 1 wherein said roughened surface of said layer of chromium is roughened by electroetching.

3. The multilayer circuit board recited in claim 1, further comprising:
   a second insulating substrate bonded to said first mentioned insulating substrate and to said layer of chromium on said copper member by said layer of adhesive.

4. A multilayer circuit board comprising:
   a first member of copper;
   a second member selected from the group consisting of an insulating substrate and copper; and
   means for bonding said first member to said second member, said means for bonding consisting essentially of:
   an electrodeposited chromium coating of approximately 10–20 microinches thickness on said first member of copper,
   said chromium coating having a roughened surface; and
   a layer of adhesive selected from the group consisting of epoxy adhesive, epoxy glass adhesive and polyimide adhesive interposed between said first and second members and bonded to the roughened surface of said chromium coating.

5. The multilayer circuit board set forth in claim 2 wherein the tensile shear strength of the bond between said layer of chromium and said layer of epoxy glass adhesive is at least 2,700 pounds per square inch.

6. A multilayer circuit board as set forth in claim 4 wherein
   said second member, when comprised of copper, having thereon a roughened, electrodeposited chromium coating of approximately 10–20 microinches thickness interposed between the copper thereof and said layer of adhesive.

7. A multilayer circuit board as set forth in claim 4 wherein the roughened surface of said chromium coating is roughened by electroetching and
wherein the tensile shear strength of the bond between the roughened surface of said chromium coating and said layer of adhesive epoxy glass is at least 2,700 pounds per square inch.

* * * * *